United States Patent [19]

Class et al.

[11] 4,422,896

[45] Dec. 27, 1983

[54] MAGNETICALLY ENHANCED PLASMA PROCESS AND APPARATUS

[75] Inventors: Walter H. Class, Yonkers, N.Y.; Steven D. Hurwitt, Park Ridge, N.J.; Michael L. Hill, New York, N.Y.; Marvin K. Hutt, Oakland, N.J.

[73] Assignee: Materials Research Corporation, Orangeburg, N.Y.

[21] Appl. No.: 342,976

[22] Filed: Jan. 26, 1982

[51] Int. Cl.³ .................... H01L 21/306; B44C 1/22; C03C 15/00; C03C 25/06

[52] U.S. Cl. .................................. 156/643; 156/345; 204/298

[58] Field of Search ............ 204/298, 192 E, 192 EC, 204/192 C, 192 R; 156/345, 643, 646; 427/38, 39, 47; 118/621, 623

[56] References Cited

U.S. PATENT DOCUMENTS

| | | | |
|---|---|---|---|
| 2,146,025 | 2/1939 | Penning | 250/27.5 |
| 3,884,793 | 5/1975 | Penfold et al. | 204/298 |
| 4,041,353 | 8/1977 | Penfold et al. | 315/267 |
| 4,126,530 | 11/1978 | Thornton | 204/192 EC |
| 4,194,962 | 3/1980 | Chambers et al. | 204/298 |
| 4,221,652 | 9/1980 | Kuriyama | 204/298 |
| 4,298,443 | 11/1981 | Maydan | 204/192 E |

FOREIGN PATENT DOCUMENTS 0027553 9/1980 European Pat. Off.

OTHER PUBLICATIONS

Research Disclosure, 610/79, pp. 537–540, Magnetron Sputtering of Magnetic Materials, No. 18626 by Meckel et al.

S. Schiller et al., "Alternating Ion Plating–A Method of High-Rate Ion Vapor Deposition," Jul./Aug. 1975, pp. 858–864, J. Vac. Sci. Technol., vol. 12, No. 4.

K. Urbanek, "Magnetron Sputtering of SiO₂; An Alternative to Chemical Vapor Deposition," Apr. 1977; pp. 87–90, Solid State Technology.

Primary Examiner—William A. Powell
Attorney, Agent, or Firm—Kenyon & Kenyon

[57] ABSTRACT

Method and apparatus are disclosed for plasma treating a substrate in a hermetic chamber with a magnetic field having lines of force which leave a support, extend across the surface of the substrate and re-enter the support to enclose the substrate exposed surface in a magnetic electron-trapping field. The voltage applied to the substrate support is adjusted to produce a dense glow discharge closely adjacent the substrate surface for reacting chemically therewith.

16 Claims, 8 Drawing Figures

MAGNETICALLY ENHANCED PLASMA PROCESS AND APPARATUS

BACKGROUND OF THE INVENTION

(1) Field of the Invention

The present invention relates to gas discharge plasma processing, and particularly to plasma etching processes and apparatus.

(2) Description of the Prior Art

Plasma processing has recently become the subject of extensive investigations as a gas phase etching process, because it is superior to wet chemical processes for etching microscopic features, when used in conjunction with a suitable etch mask, in the manufacture of silicon integrated circuits. Present day very large scale integrated circuits (VLSI circuits), such as are used for semiconductor memories and processors, require a manufacturing capability to etch patterns having micron and even sub-micron dimensions.

The typical pattern etching procedure involves first applying a film of a photosensitive, X-ray sensitive, or electron-beam sensitive polymer (called a photoresist, X-ray resist, or electron-beam resist, according to the type of sensitivity) on the surface of a previously deposited layer which is to be etched. This polymer film is then selectively exposed to sensitizing radiation through a selectively opaque pattern or by modulated beam scanning.

Subsequent development of the exposed portions of the resist causes either the exposed or the unexposed portions to be removed, depending on whether the polymer is a positive resist or a negative resist. In either case, the resulting etch mask permits selective etching away of the portions of the underlying layer from which the resist was removed during development. This layer is usually a metal or a dielectric which serves some electrical function in the integrated circuit.

When etching is completed, the remaining resist material is removed by a resist stripping process, leaving behind the unetched portions of the underlying layer in the desired pattern. An integrated circuit is produced by repeated sequences of layer deposition, resist application, exposure, development, etching, and resist stripping.

Plasma methods have several important advantages over wet chemical processes in carrying out resist development (called plasma development), layer etching (called plasma or reactive ion etching), and resist removal (called plasma stripping or plasma ashing). These methods are dry, the removed products are in gaseous form, eliminating clean up and simplifying disposal, and they can be accurately controlled by the level and timing of applying the activating voltage.

One of the most important advantages of plasma processing, however, lies in its anisotropic etching capability. Wet chemical etching is essentially an isotropic process. That is, etching proceeds in all directions at approximately the same rate, laterally as well as perpendicularly to the surface of the layer being etched. This means that undercutting of the etch mask occurs, so that pattern line width resolution less than a few times the thickness of the etch layer is not possible. Although reactive ion etching is also predominantly a chemical process, the etch rate normal to the surface can be much higher than the lateral etch rate because activating agents responsible for the process are delivered to the substrate predominantly in the former direction, for reasons explained below.

Basic to all of the above-described plasma processes is the creation of an electrical gas discharge (plasma) by imposing a direct current (dc) voltage or, preferably, a radio frequency (rf) voltage between electrodes in a space occupied by a normally non-reactive gas at low pressure. Energetic electrons emitted from the negative electrode (i.e., the cathode) collide with neutral gas atoms or molecules to create ions or other reactive species and additional electrons, thereby initiating and maintaining a highly conductive glow discharge in a region adjacent to the cathode. This glow discharge or plasma is separated from the cathode surface by a dark space or plasma sheath.

Since the plasma is essentially equipotential, the voltage drop between the plasma and the cathode occurs in the plasma sheath, and the direction of the electric field is normal to the cathode surface. Consequently, the ions and other reactive species generated in the plasma, which typically carry a positive charge, are attracted to the cathode surface and travel from the plasma to the surface primarily in a direction parallel to the electric field lines. In the plasma processes considered here, the cathode serves as a substrate support, so when the ions or reactive species reach the surface of the substrate they either activate or take part in chemical reactions resulting in the respective resist development, layer etching, and resist stripping.

As an example, plasma stripping is conducted with oxygen as the reactive gas. The electron-molecule collisions in the plasma convert molecular oxygen to atomic oxygen, as well as positive and negative oxygen ions. These reactive forms of oxygen aggressively attack the polymeric resist film, creating gaseous oxidation products such as CO, $CO_2$, and $H_2O$. The resist material is thereby effectively removed from the surface. Similar mechanisms are involved in the developing and etching procedures.

The major drawback to these plasma processes is that they are slow. The efficiency of conversion of inert gas molecules to reactive species is directly proportional to the plasma density, that is, the density of electrons in the glow discharge. In a steady-state plasma, generation of positively charged species and free electrons is balanced by their recombination into neutral gas atoms and molecules plus their loss by transport from the plasma. In a typical diode generated gas discharge only about one in $10^6$ of the gas molecules is dissociated into reactive species of the type required for plasma processing. Since the reactive species generation rate is constant in a given plasma, depletion of these species by the chemical reactions taking place in plasma processing causes the net rate to decrease. This is known as the "loading effect," in that the rate of reactive species generation is inverse to the load of material to be reacted.

In addition to its adverse influence on the plasma processing rate, loading effect can also cause serious mask undercutting in the plasma etching process. This condition occurs as normal etching nears completion. At that point, the material of the layer to be etched has been consumed, causing the depletion rate of the reactive species to drop suddenly when the underlying inert substrate material is exposed. The loading effect produces a corresponding rapid increase in reactive species availability, resulting in an abrupt increase in the lateral etch rate.

Loading effect can be reduced by increasing the reactive species generation rate. One way to do this is by increasing the pressure of the reactive gas, thereby increasing the density of molecules available for reactive species generation. Increasing the pressure reduces etch anisotropy, however, because the reactive species or activating ions have an increased probability of colliding with a gas molecule on their way through the plasma sheath, so that they impact the etch layer surface at an oblique angle.

The rate of reactive species generation also can be increased, and the loading effect concomitantly reduced, by increasing the plasma density. It is well known to increase plasma density in cathode sputtering processes by the use of a magnetic field. This causes a spiraling electron path and thus increases the probability of an ionizing collision with a gas molecule or atom. Particularly effective for increasing the ionization efficiency of plasmas are electron-trapping magnetic fields in which the lines of magnetic force cooperate with the cathode surfaces to form a completely enclosed region, preferably in which the magnetic field is orthogonal to the electric field.

These conditions are met in cylindrical post-type and hollow cathode-type magnetron sputter devices, as first disclosed by Penning (U.S. Pat. No. 2,146,025 issued on Feb. 7, 1939). Variations of the Penning structure and a more complete discussion of the theory involved are given in U.S. Pat. No. 4,041,353 issued to Penfold and Thornton on Aug. 9, 1977. The design of magnetic trapping fields for planar sputter targets is disclosed in U.S. Pat. No. 3,878,085 of Corbani and U.S. Pat. No. 4,166,018 of Chapin.

Sputtering is predominantly a physical process, however. It has been likened to sand-blasting on the molecular scale because it depends on the kinetic energy of positive ions, attracted to and striking a highly negative cathode, to dislodge neutral target atoms which then ultimately condense on the surface of a substrate exposed to the cathode.

The kinetic energy required for the chemical reactions involved in plasma processing are much lower, however, than the energies typically encountered in diode sputtering (several electron volts as compared with several hundred ev). The excess ion energy available in a sputtering system, therefore, would merely generate heat if used for plasma etching. This is highly undesirable because the polymeric materials used for etch masks cannot generally be used at temperatures above about 125° C.

SUMMARY OF THE INVENTION

It is a principal object of the present invention to provide a method and apparatus for improving the efficiency of reactive species generation in plasma assisted reactive processes and at the same time reduce the kinetic energy of such species at the substrate surface, as compared with prior art methods and apparatus.

It is a further object of the invention to provide increased rates of plasma processing for a given plasma power consumption, thereby improving the economy of such processes.

These and other objects are achieved by a method of plasma processing which includes the steps of placing at least one substrate on a substrate support in a hermetic chamber, evacuating the chamber, introducing a reactant gas into the chamber, and applying a voltage to the substrate support surface, wherein the improvement comprises:

providing a magnetic field having lines of force which leave the support, extend across the surface of the substrate exposed to the coating source, and re-enter the support to enclose said exposed surface in a magnetic electron-trapping field and adjusting the voltage to produce a dense glow discharge closely adjacent to said substrate surface.

The invention also comprises apparatus for performing the above method, and particularly including an evacuable chamber, means for evacuating the chamber, means for introducing a reactant gas at low pressure into the chamber, an electrode in the chamber having at least one substrate support surface, and means for applying a voltage to the substrate support surface, wherein the improvement comprises:

means for providing a magnetic field having lines of force which leave said electrode, extend across the substrate support surface, and re-enter said electrode to completely enclose said substrate support surface in a magnetic electron-trapping field.

In a preferred embodiment, the substrate support electrode comprises a prismatic body having a plurality of flat faces surrounding an axis of symmetry, said faces comprising at least one substrate support surface, and the means for providing said magnetic field comprises first and second spaced apart magnetic pole means of opposite polarity, each pole means projecting outwardly from the faces of and extending completely around the prismatic body, and the substrate support surfaces being located between the first and second pole means, whereby the magnetic field forms a continuous belt around the body of the electrode between the first and second pole means, and the electrode further comprises first and second annular dark space shields surrounding and radially spaced from the respective first and second magnetic pole means.

The above and other objects and features of the invention, as well as its advantages over the prior art will be more apparent from the following detailed description in connection with the accompanying drawings.

DETAILED DESCRIPTION OF THE PREFERRED EMBODIMENTS

Figure 1:
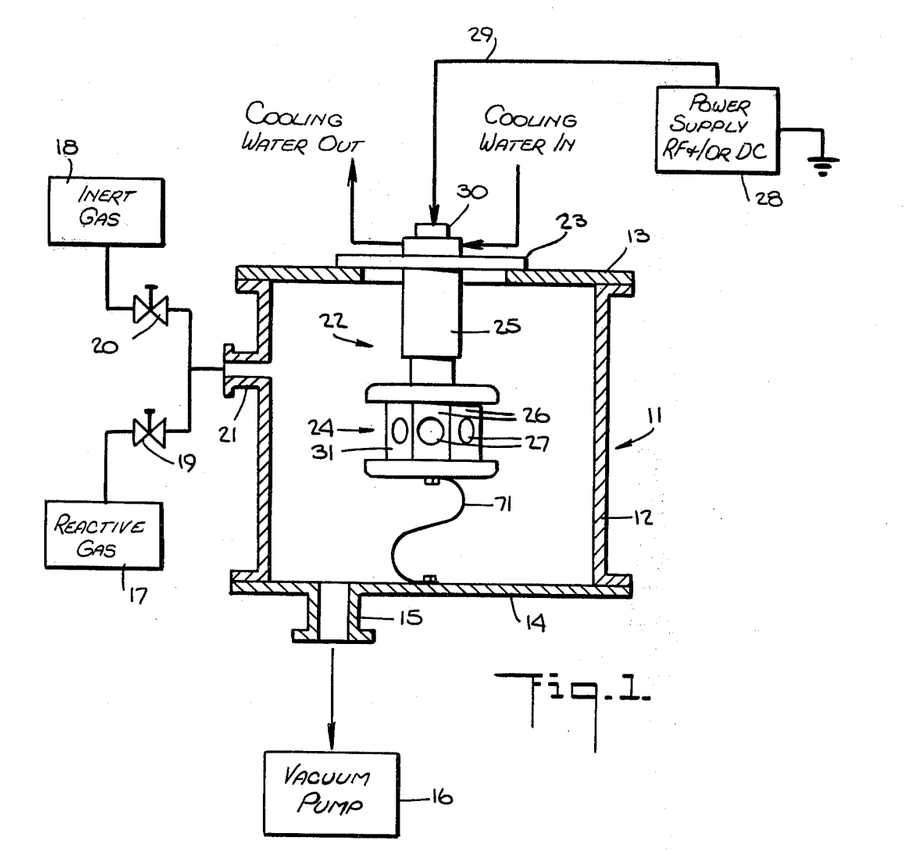
FIG. 1 is an elevation semi-schematic view in partial cross section of a plasma processing apparatus including a substrate support electrode according to the present invention.

FIG. 1 illustrates in semi-schematic form a plasma processing apparatus 10 incorporating one embodiment of a substrate support electrode according to the present invention and operable in accordance with the method of the invention. The apparatus includes a hermetic chamber 11 having an open-ended shell 12 closed by a top sealing plate 13 and a bottom sealing plate 14. For simplicity, conventional clamping means, such as bolts and nuts, and conventional seals, such as O-ring seals, which are needed to provide the necessary vacuum-tightness of the chamber assembly, are not shown.

A pump-out opening 15 in the bottom plate leads to a vacuum pump 16, and at least one reactant gas, such as oxygen, may be introduced into the chamber, either alone or with an inert gas, such as argon, from respective sources 17 and 18 through respective valves 19 and 20 and inlet 21.

A substrate support electrode assembly 22 extends into the chamber and is sealingly attached to the top plate 13 by a mounting plate 23 and suitable fasteners and seals (not shown).

The construction of the substrate support electrode assembly will be described in detail with reference to FIGS. 2 and 3, but, briefly, it includes a prismatic spool-shaped electrode 24 (of hexagonal cross section in the illustrated embodiment) suspended by a tubular support 25 which is welded or otherwise attached to mounting plate 23.

Each face 26 of the hexagonal electrode has provision for mounting a substrate 27, such as a conventional ceramic disc or semiconductor wafer used in the manufacture of integrated circuits. Rf power is supplied from a power supply 28 via line 29 to a coupling 30 mounted on the upper end of the electrode assembly 22. The rf power supply can be of any commercially available type used in conventional plasma processing systems. Coupling 30 also is equipped with inlet and outlet connections for permitting a flow of cooling water to the interior of substrate support electrode 24.

Figure 2:
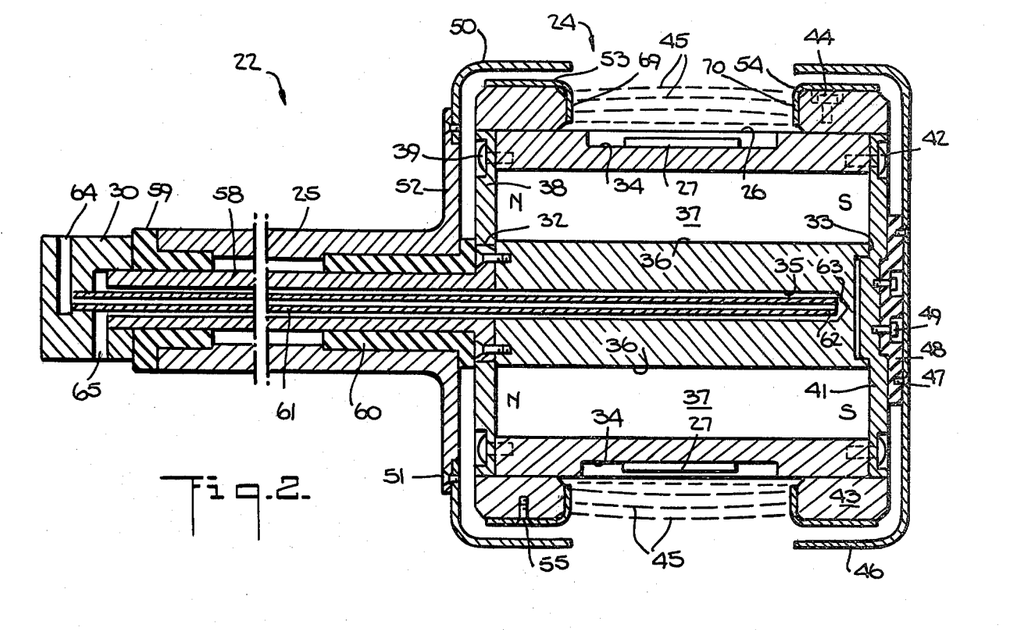
FIG. 2 is a side view in cross section of the substrate support electrode assembly of FIG. 1.
Figure 3:
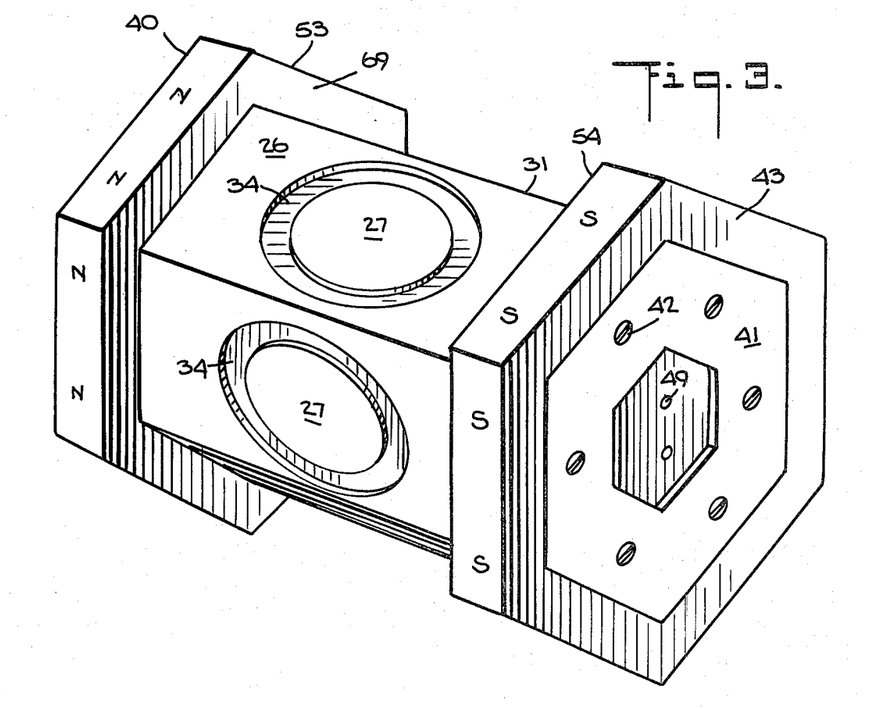
FIG. 3 is a perspective view of the substrate support electrode shown in FIG. 2.

With reference to FIGS. 2 and 3, the substrate support electrode assembly 22 comprises basically the prismatic electrode 24 (shown separately without dark space shields in FIG. 3) and associated supporting structure for suspending the electrode from mounting plate 23, so that electric power and fluid coolant can be delivered to it.

Electrode 24 is itself an assembly comprising a prismatic block 31 of electrically conductive nonmagnetic material, such as copper or aluminum, and having an upper end 32 and lower end 33. As previously described, the block has a polygonal cross section, which in the embodiment illustrated in FIGS. 1-3 is hexagonal but may be of any desired number of sides, each side forming one of the faces of the electrode. Each face of the prismatic block 31 has a shallow circular depression 34 provided with suitable conventional clamping means (not shown) for holding a substrate disc 27. Block 31 also has a central well hole 35 drilled coaxially from its upper end and a number of angularly spaced pockets 36 extending from its lower end parallel to the axis of the block, each pocket being sized to slidingly hold a bar magnet 37.

A flat upper hexagonal pole piece 38 fastened to the electrode block in contact with the upper end of each bar magnet by screws 39 provides a magnetic path to a pole piece 40 in the form of a hexagonal band surrounding the upper end of electrode block 31, the pole pieces 38 and 40 being made of soft iron or other magnetically permeable material. Pole piece 40 may be made in the form of a one piece hexagonal ring or six individual straight bars with mitred ends, as shown in FIG. 3, for simpler fabrication and assembly. A similar magnetic path is provided by a flat lower hexagonal pole piece 41 which is fastened onto the lower end 33 of electrode block 31 by screws 42 so as to contact the lower end of each bar magnet and also the inner surface of a pole piece 43, identical to pole piece 40 and surrounding the lower end of electrode block 31. Pole pieces 41 and 43 are also made of magnetically permeable material. The resulting substrate support electrode assembly thus has the shape of a prismatic spool with pole pieces 40 and 43 being fastened to electrode block 31 by machine screws 44.

All of the bar magnets are oriented in the same direction, it being immaterial whether the north-seeking poles are adjacent the upper end of the electrode block, as shown, or adjacent the lower end. The pole pieces extend the magnetic structure so that the upper flange of the spool-shaped electrode assembly forms a single magnetic pole (e.g., north in the illustrated embodiment), and the lower flange forms an opposite magnetic pole, each pole extending in a band around the respective end of the prismatic electrode block.

Magnetic lines of force, indicated by dashed lines 45, extend across the air gap between these poles and surround the electrode faces like an annular curtain or belt to form, in combination with the electrode structure, an enclosed electron trap immediately adjacent to the exposed surfaces of the substrates. The strength of this magnetic field is preferably in the range of about 50 to about 1000 Gauss.

As will be described in further detail below, in connection with FIG. 4 and the operation of the apparatus of the invention, when rf power is applied to the electrode, a dense glow discharge or plasma is created in this electron trap. To prevent this discharge from extending to the adjacent surfaces of the electrode assembly, a cup-shaped lower dark space shield 46 is attached by screws 47 to an insulator 48, which in turn is fastened to the pole piece 41 by screws 49. A corresponding umbrella-shaped upper dark-space shield 50 is attached by screws 51 to a flange 52 mounted on the lower end of the tubular support 25. In addition, to prevent contamination of the substrates 27, annular pole piece lids 53 and 54 are fastened to the exposed surfaces of pole pieces 40 and 43, respectively, by screws 55, the material of the lids being inert to the reactive species in the glow discharge.

Since the tubular support 25 is grounded to the chamber through mounting plate 23, the upper dark space shield will be at ground potential, whereas the lower dark space shield will float at an equilibrium potential by reason of its insulation from the substrate support electrode assembly 24. Alternatively, the lower dark space shield can be grounded by a flexible conductive strap 71 (FIG. 1) connected to the grounded chamber. The electrode assembly itself is attached by screws 56 to a flange 57 at the lower end of a combined rf power feed and coolant return pipe 58 mounted coaxially within tubular support 25 by means of upper and lower insulating sleeves 59 and 60, respectively. The insulating sleeves and the flange connection to the electrode body incorporate suitable conventional vacuum seals (not shown). A coolant supply pipe 61 is mounted coaxially within pipe 58 with its lower end 62 spaced from the bottom 63 of central well hole 35. This arrangement permits the flow of coolant liquid into an inlet 64 in the coupling 30, attached to the upper end of pipes 58 and 61, and down through supply pipe 61. The coolant then returns through the annular space between pipes 61 and 58 to leave the coupling 30 through outlet 65.

The operation of the above-described magnetically enhanced substrate support electrode to perform the method of the present invention will now be explained with reference to FIGS. 1 through 4. Substrates 27 which have been previously prepared for etching are loaded onto the faces of electrode 24, and then the vacuum pump 16 is turned on to evacuate the chamber 11. When a desired vacuum level has been maintained for long enough to sufficiently outgas the components in the chamber, at least one reactant gas, or a mixture of inert gas and reactant gas, depending on the material of the layer to be etched, is introduced into the chamber through valves 19 and 20 until the desired operating pressure is reached. This is typically in the range of 5 to 500 millitorr. Rf power is next applied to the substrate support electrode.

Figure 4:
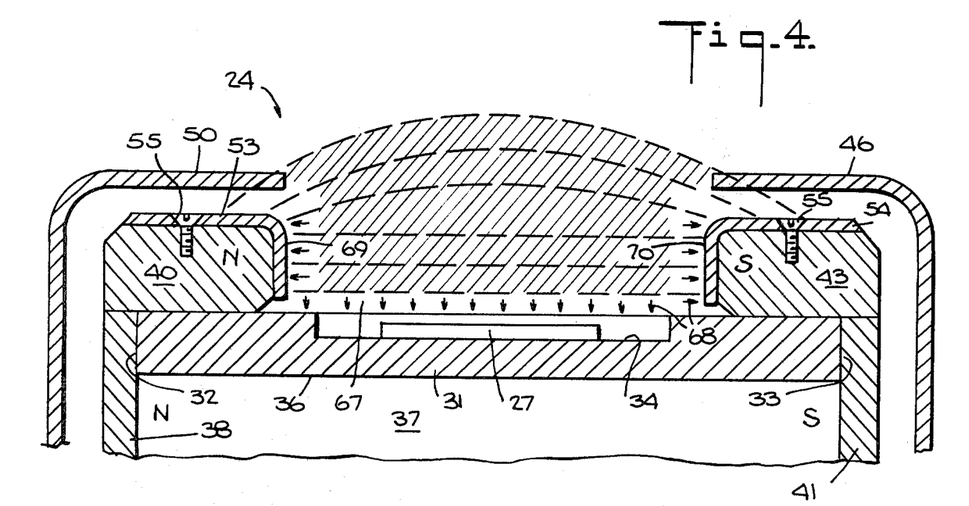
FIG. 4 is an enlarged view of the glow discharge region of the substrate support electrode of FIGS. 2 and 3.

The advantage of using the completely enclosed magnetic electron trap for the substrate support electrode of the present invention can be best understood from FIG. 4, which is an enlarged detail view of the region adjacent to one of the substrates 27 mounted on the support electrode 22.

The application of rf power to this electrode results in the formation of a dense gas discharge or plasma which is localized in the region of the magnetic belt which extends around the periphery of the electrode and is shown in cross-section in FIG. 4 by the dashed magnetic lines 45. The glow discharge itself occurs within the region contained within the diagonal lines 66. A similar confined discharge forms if a negative dc potential is applied to the electrode, but rf is preferred. Magnetic pole pieces 40 and 43 are exposed to the plasma in the regions near the magnetic gap. For this reason, they are covered by pole piece lids 53 and 54, respectively, which are made of a material which is inert to the reactive species present in the plasma.

It should be noted that the plasma region extends towards, but does not reach and touch, those surfaces which are maintained at electrode potential. The space 67 where no plasma exists is known as the plasma sheath region. It is well known that when an electrode is capacitively coupled to an rf power supply, the rectification properties of the plasma cause a dc bias to develop between the electrode surface and the plasma. (See for example Chapter 5 of "Gas Discharge Processes" by B. N. Chapman, J. Wiley & Sons, 1980). The bias is such that the plasma is positive with respect to the electrode, except for a very short time period during each rf cycle. This dc bias creates an electric field in the plasma sheath region which is everywhere perpendicular to the electrode surface. The electric field lines are indicated by arrows 68 in FIG. 4. The plasma itself is substantially free of electric fields.

The mechanism of reactive species and ion formation in the plasma starts with the emission of electrons from the negatively biased electrode surface. These so-called primary electrons are accelerated towards the plasma by the electric field in the plasma sheath 67, gaining sufficient energy to cause ionization and reactive species formation upon collision with neutral gas atoms. In the absence of the magnetic field, a large fraction of the primary electrons continue to move away from the electrode surface, thereby extending the glow discharge to regions which are far removed from the electrode surface. In addition, many do not collide with a gas atom before they reach an anode surface, such as the grounded chamber walls, so that the degree of ionization and reactive species generation is limited.

The enclosed magnetic field of FIG. 4 alters the electron trajectories, dramatically improving this situation. Consider, for example, those electrons which are emitted from the electrode face 26 and from the exposed surface of the substrate 27. Here the sheath electric field lines 68 are perpendicular to the magnetic field lines 45. As a result, the ExB electron drift motion is directed out of the plane of FIG. 4, causing the electrons to circulate around the periphery of the prismatic electrode, remaining at all times in the magnetic belt, very close to substrates 27, whereby ionization or reactive species generation induced by these electrons is confined to a plasma region close to the electrode surface.

The electrons emitted from the pole piece surfaces 69 and 70 (FIG. 4) are confined in a different way. Here, the sheath electric field lines are parallel to the magnetic field lines, so the electrons, after acceleration into the plasma region, continue to move in a spiralling manner parallel to the magnetic field lines. This motion carries the electrons to the opposite surface; i.e., electrons emitted by surface 69 move towards surface 70 and visa versa. However, upon approaching the opposite sheath field, the electrons are repelled back into the plasma, therefore oscillating to and fro, and are consequently also trapped close to the substrate surfaces.

Thus, all the electrons are trapped by the combined action of the closed loop E×B drift, and the oscillating to-and-fro motion. Electrons can escape from this trap only slowly, when collisions with gas atoms cause them to cross magnetic field lines until they finally move to electrically grounded upper dark space shield 50 or to lower dark space shield 46, whereupon they are removed from the discharge. The radial spacing between the electrode face 26 and the plane defined by shields 46 and 50 therefore largely determines the thickness of the plasma belt which, as can be seen from FIG. 4, is very close to the substrate surface.

The positive ion trajectories are determined by the same plasma sheath electric field, but the positive ions are virtually unaffected by the magnetic fields used in this device (typically 50 to 1000 Gauss) because their mass is so much greater than that of the electrons. Because the sheath field is perpendicular to the electrode surfaces, the positively charged reactive species and ions are accelerated toward the electrode surfaces 26, 69, and 70 and, more importantly, toward the substrate surface, in directions parallel to the electric fields. This results in the previously-described advantageous etch anisotropy. Furthermore, the shape of the magnetic field of the present invention provides additional advantages which improve the results when performing reactive plasma etching.

Firstly, the magnetic field extending parallel and closely adjacent to the electrode faces 26 substantially reduces the electric field in the plasma sheath region. Since this field defines the energy gained by the ions and reactive species which are accelerated towards the exposed surface of the substrate, a reduction in the electric field results in an equivalent reduction in the energy of the particles striking the substrate surface.

Lower average ion energies at impact result in less substrate heating. Thus, even with the large reactive species flux created by the magnetically enhanced plasma, the polymer material of the etch mask remains below the temperature at which significant degradation will occur.

At the same time, the lower energy of the reactive species or activating ions at impact does not reduce the rate of chemical reaction between the reactive species and atoms of the material of the substrate layer being etched. This reaction rate does not increase significantly if the energy of the reactive species particles striking the substrate is increased above a relatively low level.

Secondly, the efficient trapping of electrons by the combined electrode surface-magnetic field configuration produces a dense closely-confined plasma, which in turn creates a high level of reactive species in a region very close to the substrate surface, thereby increasing the reaction rate for a given power input and reducing the loading effect. This avoids loading effect-induced mask undercutting without the need for improved etch end point detection.

Thirdly, the reduced plasma sheath thickness also reduces the probability of scattering collisions between reactive species travelling to the substrate and neutral gas atoms in the sheath region, thereby still further contributing to etch anisotropy, especially at higher gas pressures.

The beneficial effects of the present invention are not limited to the substrate support electrode embodiment shown in FIGS. 1 and 2. In fact, almost any electrode configuration which incorporates a magnetic field and in which the magnetic lines of force emerge from and re-enter the electrode surface and pass closely adjacent to the exposed substrate surface will satisfy the required electron confinement conditions.

Figure 5:
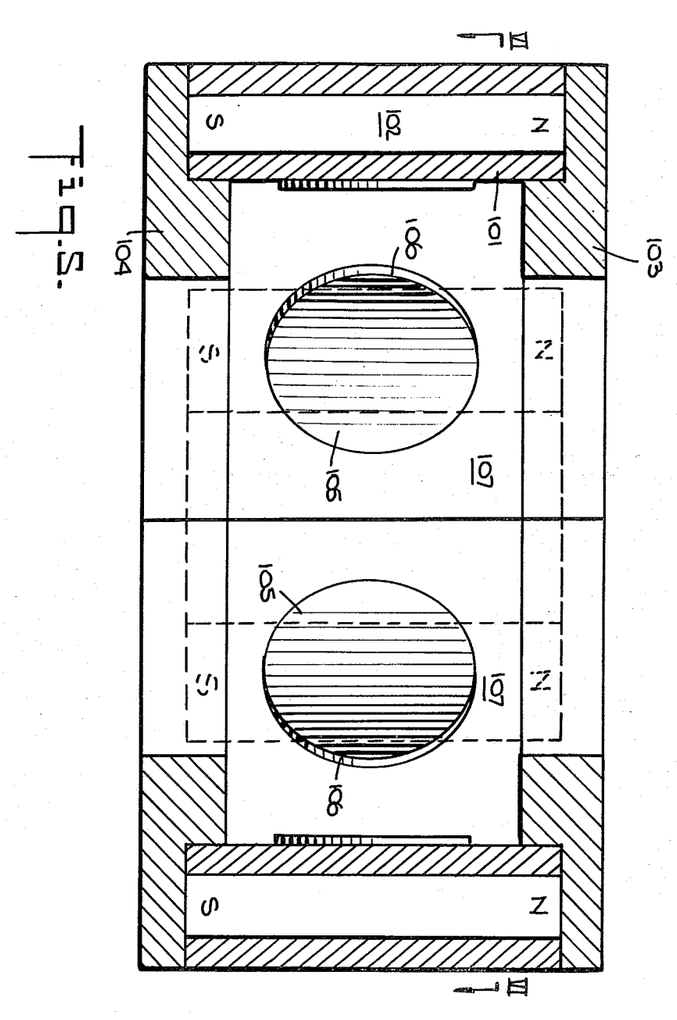
FIG. 5 is an elevation view in cross-section of an alternative embodiment of a substrate support electrode according to the invention.
Figure 6:
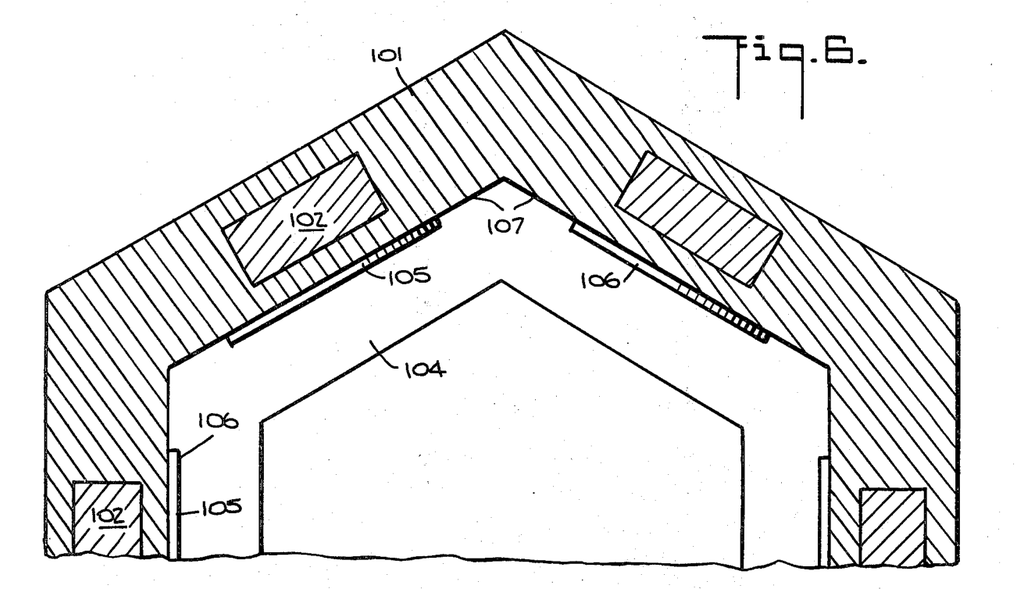
FIG. 6 is a plan view in cross section of one half of the substrate support electrode of FIG. 5, taken along line VI—VI, the other half of the structure being symmetrical with that illustrated in the drawing.

FIGS. 5 and 6, for example, show in schematic form an inverted arrangement of the substrate support electrode of FIGS. 2 and 3, in which a closed magnetic curtain extends around the interior circumference of a toroidal electrode 101. The electrode has permanent bar magnets 102 mounted in holes in the electrode body. The magnets contact pole pieces 103 and 104 to form a closed loop magnetic field around the interior portion of the toroidal electrode, with the magnetic field lines extending substantially parallel and closely adjacent to the exposed surfaces 105 of substrates 106 mounted on electrode surface 107. The substrates are therefore exposed to the same type of dense gas discharge generated with the electrode embodiment of FIGS. 2 and 3 under the previously-described operating conditions. Not shown are dark-space shields, pole piece lids, means of applying rf power to the electrode, and hermetic chamber, all of which can be similar to those of the previously-described embodiment.

Figure 7:
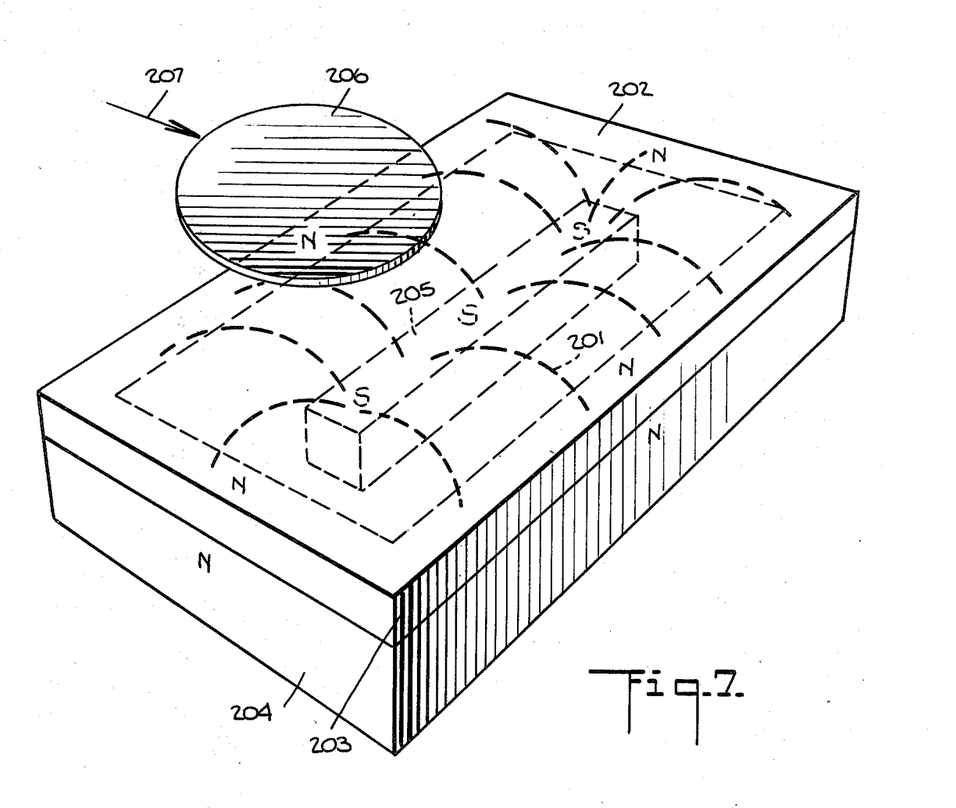
FIG. 7 is a perspective view of another embodiment of a substrate support electrode according to the invention.
Figure 8:
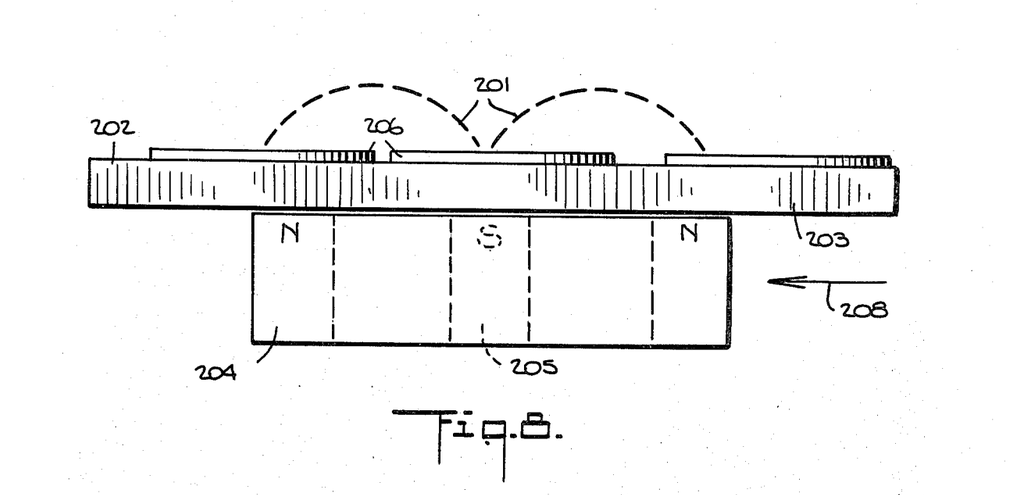
FIG. 8 is an elevation view of still another embodiment similar to that of FIG. 7.

The improved magnetically enhanced plasma process of the present invention may also be practiced, as shown in FIGS. 7 and 8 by creating a closed-loop magnetic field 201 adjacent to a planar surface 202 of an electrode plate 203. This field shape is produced by permanent magnets 204 and 205 placed behind the electrode plate to create a tunnel-like magnetic field having lines of force which leave the surface, arch over, and re-enter the surface. Substrates 206 can be plasma processed by moving them across the face of the electrode in the direction of arrow 207, as shown in FIG. 7. Alternatively, magnets 204 and 205 can be moved relative to electrode plate 203 in the direction of arrow 208, while the substrates remain stationary on surface 202, as shown in FIG. 8.

EXAMPLE

To illustrate the advantages resulting from the present invention, a substrate support electrode having a construction as in the embodiment of FIGS. 2 and 3 was installed in a sputtering system similar to that of FIG. 1 and used for stripping a polymer resist from the surface of the silicon wafer. After initial evacuation of the chamber, oxygen was introduced until the chamber pressure reached about 20 millitorr. Wafer temperature rise and photoresist removal rate were measured simultaneously. The heat flux delivered to the wafer was then computed from the temperature rise and divided into the stripping rate to produce a stripping efficiency factor (removal rate vs. watt density). Comparison with a corresponding efficiency factor for a standard diode process indicated a four-fold improvement for the magnetically enhanced process for the present invention.

It was noted, further, that the plasma sheath thickness of the magnetically enhanced substrate support electrode was reduced by a factor of about 10 from that for a standard diode configuration, and that the operating voltage of the substrate support electrode was reduced by a factor of 10 to 20. This means that the kinetic energy gained by the reactive species while passing through the sheath was reduced by the same factor, thereby achieving the beneficial low impact energy described above.

We claim:

1. A method of plasma processing which includes the steps of placing at least one substrate on a substrate support electrode positioned in a hermetic chamber, evacuating the chamber, introducing a reactant gas into the chamber, and applying a voltage to the substrate support, wherein the improvement comprises:
   providing a magnetic field having lines of force which leave the support electrode, extend across the surface of the substrate exposed to the coating source, and re-enter the support to enclose said exposed surface in a magnetic electron-trapping field;
   adjusting the voltage applied to the substrate support to produce a dense glow discharge closely adjacent to said substrate surface such that molecules of the reactant gas become ionized and are electrically attracted to the substrate; and
   chemically reacting a selected material on the surface of the substrate with ions of the reactant gas.

2. The method of claim 1 wherein said magnetic lines of force extend approximately parallel to the exposed surface of at least one substrate.

3. The method of claim 1 wherein the step of placing at least one substrate on said substrate support comprises placing a plurality of substrates in spaced relation on a closed surface.

4. The method of claim 3 wherein the closed surface is a prismatic surface.

5. The method of claims 3 or 4 wherein the substrates are placed around the periphery of the closed surface.

6. The method of claim 1 wherein the step of applying a voltage to the substrate support comprises applying a capacitively coupled rf voltage to the substrate support.

7. The method of claim 1 wherein the strength of said magnetic field is between about 50 to about 1000 Gauss.

8. A plasma processing apparatus including an evacuable chamber, means for evacuating the chamber, means for introducing at least one reactant gas at low pressure into the chamber, a single active electrode in the chamber having at least one substrate support surface electrically insulated from the chamber, and means for applying a voltage to the substrate support surface, wherein the improvement comprises:

means for providing a magnetic field having lines of force which leave said electrode, extend across the substrate support surface, and re-enter said electrode to completely enclose said substrate support surface in a magnetic electron-trapping field;

the reactant gas being selected to produce ions capable of chemically reacting with a material on the surface of the substrate; and the voltage applied by the means for applying voltage to the substrate being sufficient to ionize molecules of the reactant gas and to attract the ions of said gas to the substrate for reacting chemically with a selected material on the surface of the substrate.

9. A plasma processing apparatus according to claim 8 wherein said substrate supporting surface comprises at least part of a peripheral surface of said electrode, and said means for providing a magnetic field comprises first and second spaced apart magnetic pole means of opposite polarity, each pole means projecting outwardly from and extending completely around said peripheral surface, and said substrate support surface being located between the first and second magnetic pole means.

10. A plasma processing apparatus according to claim 9, further comprising first and second dark-space shields spaced radially outwardly from and extending completely around the respective first and second magnetic pole means, said shields being insulated from said substrate support electrode.

11. A plasma processing apparatus according to claim 8 wherein said electrode comprises a prismatic body having a plurality of flat faces surrounding an axis of symmetry, said faces comprising at least one substrate support surface, and the means for providing said magnetic field comprises first and second spaced apart magnetic pole means of opposite polarity, each pole means projecting outwardly from the faces of and extending completely around the prismatic body, and the substrate support surfaces being located between the first and second pole means, whereby the magnetic field forms a continuous belt around the body of the electrode between the first and second pole means.

12. A plasma processing apparatus according to claim 11, further comprising first and second dark-space shields spaced radially outwardly from and extending completely around the respective first and second magnetic pole means, said shields being insulated from said substrate support electrode.

13. A plasma processing apparatus according to claim 8 wherein said electrode comprises a prismatic toroid having a plurality of flat inner surfaces facing an axis of symmetry, said surfaces comprising the at least one substrate support surface, and the means for providing said magnetic field comprises first and second spaced apart magnetic pole means of opposite polarity, each pole means projecting from the flat inner surfaces toward and extending completely around said axis of symmetry, and the substrate support surfaces being located between the first wand second pole means, whereby the magnetic field forms a continuous curtain between the substrate support surfaces and the axis of symmetry.

14. A plasma processing apparatus according to claim 8 wherein said electrode comprises a planar surface.

15. The method of claim 1 wherein the reactant gas is chosen to produce a gaseous reaction product with the selected material on the surface of the substrate.

16. A plasma processing apparatus according to claim 8 wherein the reactant gas is chosen to produce a gaseous reaction product with the selected material on the surface of the substrate.

* * * * *